US010882735B2

(12) United States Patent
Kuang et al.

(10) Patent No.: US 10,882,735 B2
(45) Date of Patent: Jan. 5, 2021

(54) VERTICAL STOPPER FOR CAPPING MEMS DEVICES

(71) Applicant: Analog Devices, Inc., Norwood, MA (US)

(72) Inventors: Jinbo Kuang, Acton, MA (US); Gaurav Vohra, Sudbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/254,065

(22) Filed: Jan. 22, 2019

(65) Prior Publication Data

US 2019/0152766 A1 May 23, 2019

Related U.S. Application Data

(62) Division of application No. 15/650,822, filed on Jul. 14, 2017, now Pat. No. 10,239,746.

(60) Provisional application No. 62/420,893, filed on Nov. 11, 2016.

(51) Int. Cl.
*B81B 3/00* (2006.01)
*B81C 1/00* (2006.01)

(52) U.S. Cl.
CPC .......... *B81B 3/0051* (2013.01); *B81B 3/0013* (2013.01); *B81B 3/0059* (2013.01); *B81C 1/00976* (2013.01); *B81B 2207/012* (2013.01); *B81C 2201/11* (2013.01); *B81C 2203/0109* (2013.01); *B81C 2203/0118* (2013.01)

(58) Field of Classification Search
CPC .............................................. B81B 2207/012
See application file for complete search history.

(56) References Cited

U.S. PATENT DOCUMENTS

| 5,415,726 A | 5/1995 | Staller et al. |
| 5,490,421 A | 2/1996 | Ueyanagi |
| 8,319,397 B2 | 11/2012 | Ko et al. |
| 8,939,029 B2 | 1/2015 | Zhang et al. |
| 9,134,337 B2 | 9/2015 | Simoni et al. |
| 9,206,032 B1 * | 12/2015 | Kang .................... B81B 7/0058 |
| 9,643,838 B1 * | 5/2017 | Chu .................... B81C 1/00285 |
| 10,585,111 B2 * | 3/2020 | Zhang .................... G01P 15/125 |
| 2010/0089153 A1 | 4/2010 | Zhang et al. |

(Continued)

FOREIGN PATENT DOCUMENTS

| EP | 1 947 053 A2 | 7/2008 |
| EP | 1 950 174 A2 | 7/2008 |

(Continued)

OTHER PUBLICATIONS

International Preliminary Report on Patentability dated May 23, 2019 in connection with International Application No. PCT/US2017/061001.

(Continued)

*Primary Examiner* — Thao P Le
(74) *Attorney, Agent, or Firm* — Wolf, Greenfield & Sacks, P.C.

(57) ABSTRACT

Capped microelectromechanical systems (MEMS) devices are described. In at least some situations, the MEMS device includes one or more masses which move. The cap may include a stopper which damps motion of the one or more movable masses. In at least some situations, the stopper damps motion of one of the masses but not another mass.

20 Claims, 11 Drawing Sheets

(56) References Cited

U.S. PATENT DOCUMENTS

| | | | |
|---|---|---|---|
| 2011/0226059 A1 | 9/2011 | Wellner et al. | |
| 2012/0125104 A1 | 5/2012 | Qiu et al. | |
| 2012/0167683 A1 | 7/2012 | Wang | |
| 2012/0248553 A1* | 10/2012 | Takano | G01P 1/023 257/415 |
| 2013/0020693 A1 | 1/2013 | Yiu et al. | |
| 2013/0081464 A1 | 4/2013 | Park et al. | |
| 2014/0165724 A1 | 6/2014 | Krylov et al. | |
| 2014/0374856 A1* | 12/2014 | Chen | B81B 3/0005 257/418 |
| 2015/0048903 A1 | 2/2015 | Rogers | |
| 2015/0241216 A1 | 8/2015 | Ahtee et al. | |
| 2015/0260517 A1 | 9/2015 | Su et al. | |
| 2016/0185592 A1 | 6/2016 | Hsieh et al. | |
| 2016/0216290 A1 | 7/2016 | Tang et al. | |
| 2016/0257559 A1 | 9/2016 | Chuang et al. | |
| 2017/0328800 A1* | 11/2017 | Li | G01L 9/0072 |
| 2017/0328931 A1 | 11/2017 | Zhang et al. | |
| 2018/0134543 A1 | 5/2018 | Kuang et al. | |

FOREIGN PATENT DOCUMENTS

| | | | |
|---|---|---|---|
| EP | 1947053 A2 * | 7/2008 | ........ G01P 15/0802 |
| EP | 2 390 671 A2 | 11/2011 | |
| EP | 2 453 570 A2 | 5/2012 | |
| JP | 2008-292451 A | 12/2008 | |
| JP | 2010-060336 A | 3/2010 | |
| JP | 2011-247812 A | 12/2011 | |
| JP | 2013-501941 A | 1/2013 | |
| KR | 101321270 B1 | 11/2013 | |
| WO | WO 99/42843 A1 | 8/1999 | |

OTHER PUBLICATIONS

International Search Report and Written Opinion dated Mar. 6, 2018 in connection with International Application No. PCT/US2017/061001.

Extended European Search Report dated Jun. 19, 2020 in connection with European Application No. 17868755.4.

* cited by examiner

US 10,882,735 B2

VERTICAL STOPPER FOR CAPPING MEMS DEVICES

CROSS REFERENCE TO RELATED APPLICATIONS

This application is a divisional claiming the benefit of U.S. application Ser. No. 15/650,822, filed Jul. 14, 2017, and entitled "Vertical Stopper For Capping MEMS Devices," which is hereby incorporated herein by reference in its entirety.

U.S. application Ser. No. 15/650,822 claims the benefit of U.S. Provisional Patent Application Ser. No. 62/420,893, filed Nov. 11, 2016 and entitled "Vertical Stopper For Capping MEMS Devices," which is hereby incorporated herein by reference in its entirety.

FIELD OF THE DISCLOSURE

The present application relates to capping technology for capping microelectromechanical systems (MEMS) devices.

BACKGROUND

Some microelectromechanical systems (MEMS) devices include a movable proof mass. Examples are resonators, accelerometers, and gyroscopes. The proof mass may be formed on one substrate, or wafer, referred to as a MEMS wafer. A capping structure is sometimes bonded to the MEMS wafer to form a sealed enclosure around the proof mass.

SUMMARY OF THE DISCLOSURE

Capped microelectromechanical systems (MEMS) devices are described. In some situations, the MEMS device includes one or more masses which move. The cap may include a stopper which damps motion of the one or more movable masses. In some situations, the stopper damps motion of one of the masses but not another mass.

According to one aspect of the present application, a method of operating a microelectromechanical systems (MEMS) device sealed in a cap that comprises a stopper is provided. The method may comprise oscillating a movable proof mass of the MEMS device in a first in-plane mode having a mode shape, wherein the stopper is shaped to overlie a periphery of the mode shape and/or internal edges of the movable proof mass, and damping the motion of the movable proof mass in the first mode using the stopper.

According to another aspect of the present application, a method of providing damped motion of a capped microelectromechanical systems (MEMS) device is provided. The method may comprise oscillating a movable proof mass springedly coupled to a substrate over a mode shape in a plane of motion parallel to and within 20 microns of a stopper of a cap which is coupled to the substrate. The movable proof mass has outer and/or inner edges underlying the stopper.

According to another aspect of the present application, a MEMS device is provided. The MEMS device may comprise a first movable proof mass, and a cap covering the first movable proof mass, wherein the cap comprises a stopper overlying greater than 50% of the first movable proof mass.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
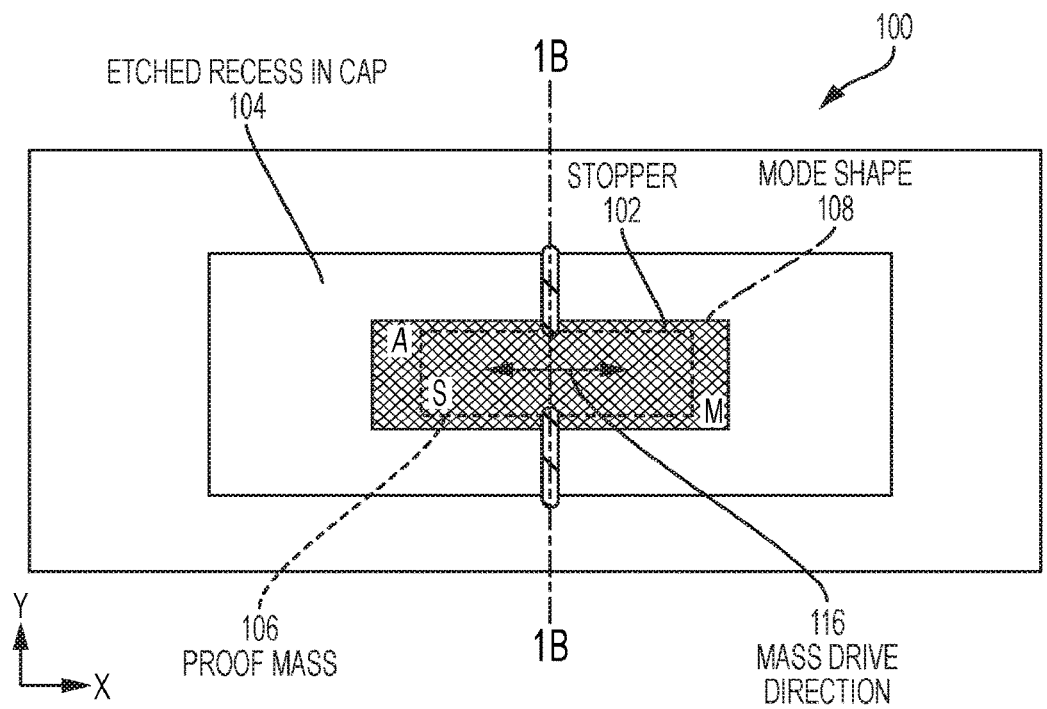
FIG. 1A is a schematic diagram illustrating a microelectromechanical systems (MEMS) device comprising a proof mass sealed in a cap that comprises a stopper, according to some non-limiting embodiments.

Aspects of the present application provide a capping structure for microelectromechanical systems (MEMS) devices in which the capping structure includes a stopper or protrusion shaped and positioned to damp motion of a capped MEMS component. In some embodiments, the stopper of the cap aligns with a proof mass oscillating in an in-plane mode on a MEMS wafer being capped. The stopper may be shaped and positioned to overlie regions through which gas flows when the MEMS component moves, thus providing damping functionality by preventing, redirecting, or otherwise impeding such gas flow. For example, in some embodiments the stopper overlies a periphery of the mode shape of the movable proof mass and/or internal edges of the movable proof mass. The stopper may be aligned with the movable proof mass and have a surface area greater than 50% of the movable proof mass, between 60% and 130% the area of the movable proof mass, or any value within those ranges.

Some MEMS devices include a movable proof mass suspended above a surface of a wafer and retained with beams that serve as elastic springs. A quality factor (Q) may be defined to describe the qualitative behavior of the oscillation of a movable proof mass, and may represent a comparison of the frequency bandwidth of the MEMS component relative to its center frequency. Higher Q indicates a lower rate of energy loss relative to the stored energy of the movable proof mass. Q with different values may be desired depending on the specific systems and applications. The inventors have recognized and appreciated that the configuration of the capping structure allows control of the Q of a movable proof mass.

According to one aspect of the present application, the MEMS device may be a resonator having a movable proof mass sealed by a capping structure with a stopper. The stopper may be proximate, but spaced apart from the movable proof mass which it overlies. The movable proof mass may be configured to move in-plane, with the stopper being disposed out of the plane. The stopper may perform a damping function by limiting the volume of the sealed enclosure, thus limiting the potential displacement of gas within the enclosure when the proof mass moves. Therefore, the Q of the resonator may be controlled by designing the stopper to provide a target degree of damping, which may be regulated by the placement and/or surface area of the stopper relative to the movable proof mass, and/or the distance of the gap between the stopper and the movable proof mass.

According to another aspect of the present application, the MEMS device may be an accelerometer having a resonator and one or more sense fingers sealed by a capping structure having a stopper. The stopper may be sized to overlie the resonator but not the sense fingers such that the effect of the damping may be reduced or minimized on the sense fingers' response to the force exerted by the movable proof mass of the resonator. The accelerometer may include at least two resonators (e.g., a differential accelerometer) that are aligned with and underlie the stopper.

According to another aspect of the present application, the MEMS device may be a gyroscope having a resonator and an accelerometer sealed by a capping structure having a stopper. The stopper may overlie the resonator but not the accelerometer to any significant degree. Such a configuration may damp motion of the resonator more than that of the accelerometer, and in this respect may be said to provide selective damping. As a result, this configuration may allow separate control of the resonator Q and the accelerometer Q. The resonator Q may be comparable to that which would be achieved with a sealed enclosure at greater pressure, thus allowing the use of a lower pressure to attain a higher accelerometer Q while maintaining the same resonator Q. This configuration may also reduce the electrical coupling from the resonator to the sense fingers of the accelerometer because the damping stopper may act as a shield.

In some embodiments, the gyroscope may include a movable Coriolis proof mass and at least two resonators sealed by a capping structure having a stopper. Mismatches of the motion of the at least two resonators may cause phase dispersion, resulting offset, gee-sensitivity and coupling of energy between the gyroscope and the packaging. Lower Q of the resonators may reduce such effect. However, lower Coriolis Q causes higher gyroscope noise. Thus, the inventors have recognized that in at least some embodiments including a resonator and a Coriolis proof mass, it may be desirable to lower the Q of the resonator(s) but not the Coriolis proof mass. Accordingly, the stopper may overlie the at least two resonators but not the movable Coriolis proof mass such that the resonator Qs are reduced substantially compared to a scenario in which no stopper is provided while the Coriolis Q is at most slightly decreased. Such a configuration may facilitate use of a lower capping pressure to provide the same resonator Q as would be achieved without a damping stopper, while providing an increased Coriolis Q. This configuration may also reduce the electrical coupling from the resonators to the Coriolis electrodes.

The aspects and embodiments described above, as well as additional aspects and embodiments, are described further below. These aspects and/or embodiments may be used individually, all together, or in any combination of two or more, as the application is not limited in this respect.

Figure 1B:
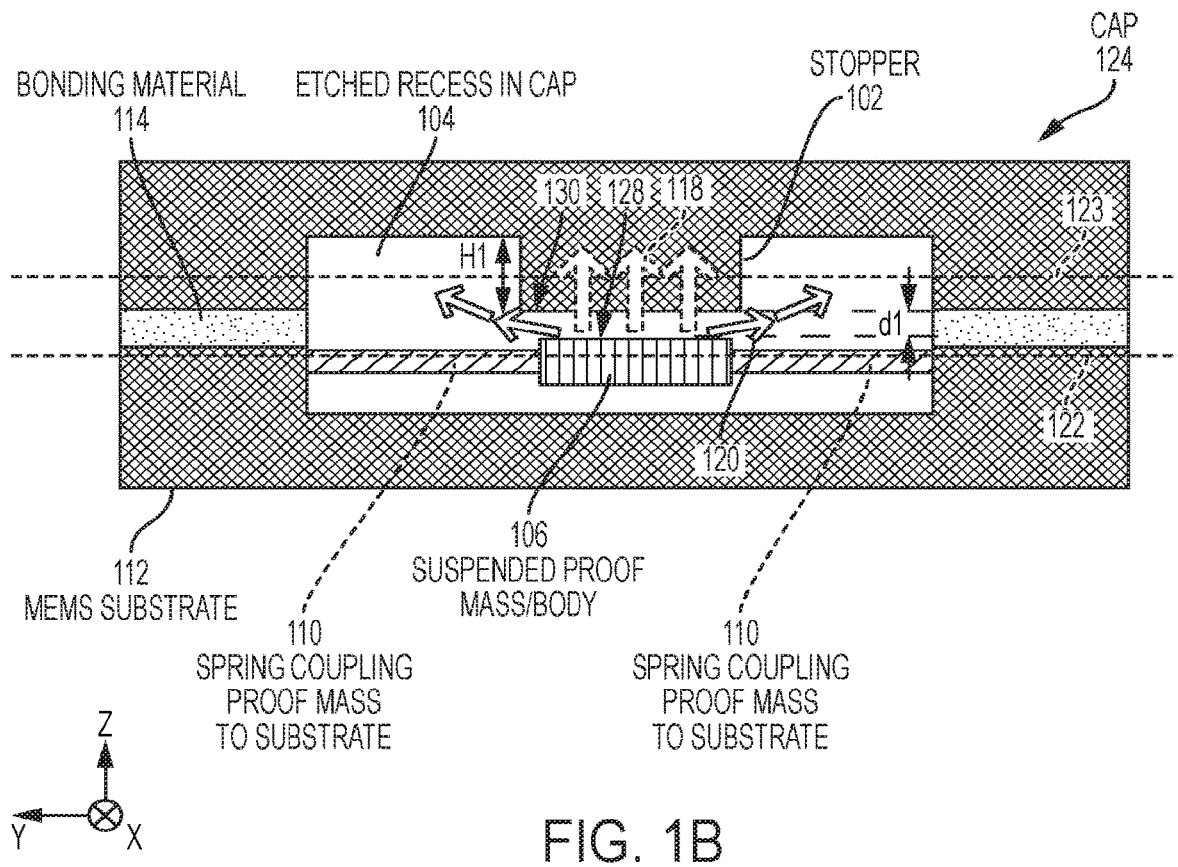
FIG. 1B is a cross-sectional view of the MEMS device in FIG. 1A along the dashed line 1B.

FIG. 1A illustrates in top view multiple superimposed planes of a microelectromechanical systems (MEMS) device 100 having a damping stopper overlying a movable proof mass, according to a non-limiting embodiment of the application. FIG. 1B illustrates a cross-sectional view of the MEMS device 100 along the dashed line 1B of FIG. 1A. FIG. 1A shows a superposition of the planes along the lines 122 and 123 of FIG. 1B—that is, FIG. 1A illustrates a plane though the cap superimposed on a plane though the MEMS substrate.

The MEMS device 100 includes a MEMS substrate 112 sealed by a cap 124 with a bonding material 114. The MEMS substrate 112 may include a movable proof mass 106 suspended above a cavity by springs 110. The cap 124 includes a stopper 102 positioned to overlie the movable proof mass 106, and in the illustrated example has a proximate to and parallel to the proof mass 106 with a surface area greater than that of a surface of the proof mass proximate to and parallel with the stopper.

The MEMS substrate 112, which may be a wafer in some embodiments or alternatively a diced chip in other embodiments, may include a suspended proof mass 106 and springs (or "tethers") 110 that couple the proof mass to the MEMS substrate 112. In this manner, the proof mass 106 may be suspended above a cavity in the MEMS substrate 112. The MEMS substrate 112 may be formed of silicon, or more generally a semiconductor material, or any other suitable material. The proof mass 106 and springs 110 are formed of the same material in some non-limiting embodiments, for example being etched from the MEMS substrate 112. However, in other embodiments the proof mass and springs may be formed of different materials, or at least different stacks of materials.

FIG. 1A illustrates an outline of the proof mass 106 in dashed lining. The proof mass 106 may be suspended from the MEMS substrate 112 by the springs 110 in a configuration allowing motion of the proof mass along the direction 116 shown in FIG. 1A. For example, the proof mass may be a resonator driven along the direction 116. Alternatively, the proof mass may be part of an accelerometer, allowed to move along the direction 116 in response to experiencing acceleration. Irrespective of the type of proof mass employed, the movement of the proof mass may define a mode shape, illustrated in FIG. 1A as mode shape 108. In the illustrated example, the mode shape 108 may have a planar area M of a greater lateral extent in the x-direction than the proof mass 106, meaning the proof mass 106 may move from its equilibrium position in both the positive and negative x-direction. The illustrated mode shape is a non-limiting example, as other modes of vibration (or, more generally, motion) are possible. Also, depending on the type of MEMS device, additional structures may be included, such as electrodes on the proof mass 106, electrical connection traces, or other structures. These optional structures are omitted from the figure for simplicity of illustration.

The cap 124, which may be a semiconductor material or any other suitable material, may include a stopper 102 surrounded by a recess 104. The stopper may have a surface 130 with a surface area A facing the MEMS substrate 112. The recess 104 may be formed by etching, such that the stopper 102 may represent a protrusion, plateau, extension, bump, or other similar structure. The stopper 102 may be positioned in the central region of the cap 124 in some embodiments, although alternative positioning may be used in other embodiments. In some embodiments, the cap may be a silicon wafer and the stopper may be formed by etching the silicon wafer. The depth of the recess 104 may be between 20 μm and 150 μm, including any value within that non-limiting range (e.g., 80 μm). The surface 130 of the stopper may be separated from the substantially parallel top surface 128 of the proof mass by a gap with a distance d1. The distance d1 may be less than 20 μm in some examples, including any value within that non-limiting range (e.g., between 2 μm and 20 μm, or between 3 and 10 μm).

As described above, aspects of the present application provide a stopper of a cap for a MEMS device which operates as a damper. In at least some embodiments, then, the stopper may be a damping stopper, performing the dual functions of damping motion of the proof mass and stopping motion of the proof mass from extending beyond an allowable limit. One or more features of the stopper may be selected to provide the damping functionality. For example, the stopper may be positioned to overlie a periphery of the mode shape of the proof mass. Considering FIGS. 1A and 1B as an example, the in-plane perimeter of the stopper 102 overlies the periphery of the mode shape 108. In some embodiments, the perimeter of surface 130 may extend beyond the periphery of the mode shape 108. For example, the surface area A of surface 130 may be greater than the area M of the mode shape 108. As the proof mass 106 moves it will push the surrounding gas, to the extent there is any, at its perimeter. Positioning the stopper 102 to overlie the periphery of the mode shape 108 may stop, redirect, or otherwise impede such flow of the gas, which will in at least some embodiments damp the motion of the proof mass 106.

In some embodiments, the damping functionality of a stopper of a cap for a MEMS device may be achieved by sizing the stopper to have a surface area representing a substantial percentage of the surface area of the underlying proof mass. Referring to FIGS. 1A and 1B, the surface area A may be selected to substantially correspond to the surface area S of the proof mass 106, for example being greater than 50% of S. In some embodiments, the surface area A may be between 75% and 125% of the area S of the surface 128 and/or area M of the mode shape 108, including any value within this range. Irrespective of whether the stopper overlies a periphery of the mode shape 108, the stopper 102 may damp motion of the proof mass 106 by limiting the volume of the sealed enclosure in which the proof mass is disposed, thus limiting the potential displacement of gas within the enclosure when the proof mass 106 moves. For example, some air would move in the direction of arrows 118 if stopper 102 was omitted or had a different shape/size; instead, the air is forced to move in the direction of arrows 120 because of the stopper. Therefore, the Q of the movable proof mass may be adjusted by the placement and/or surface area of the stopper relative to the movable proof mass, and/or the distance of the gap between the stopper and the movable proof mass. Thus, not all embodiments employ a stopper overlying a periphery of the mode shape of the proof mass.

The size of the gap d1 may also be used to facilitate damping of the motion of proof mass 106. Making d1 small serves to limit the volume of the enclosed cavity in which the proof mass 106 is disposed. Doing so, as described above, contributes to damping the in-plane motion of the proof mass 106. The value of d1 may be any of the values described above.

Thus, features of the stopper 102 including the sizing, positioning relative to the proof mass 106, and distance d1 from the proof mass be selected to facilitate the damping functionality of the stopper 102. In general, the stopper 102 surface 130 may have a rectangular shape, a ring shape, a discontinuous shape, or any other suitable shape. The surface 130 may have an area A sized according to any of the dimensions described above relative to the area S of the proof mass 106. The distance d1 may be any of the values described above.

The bonding material 114 may be epoxy, glass frit, adhesive, eutectic bonding material, or any other suitable bonding material. The thickness of the bonding material may be in the range of 2 μm to 20 μm, for example being between 3 and 10 μm, including any value within those ranges. The bond may provide a hermetic seal.

The MEMS substrate 112 may be sealed by the cap 124 in an environment with a desired pressure/gas composition. In some embodiments, the structure of FIGS. 1A and 1B allows for achieving the same or higher device Q while sealing the device with a lower pressure than would result from a cap lacking a damping stopper. For example, in some embodiments the pressure may be between two to five times lower (e.g., 100 mbar instead of 300 mbar) when using a cap with a damping stopper of the types described herein, while providing the same Q of the MEMS device. Other pressure reductions are also possible.

While FIGS. 1A and 1B illustrate a single proof mass 106 and stopper 102, the various aspects described herein are not limited in this manner. As described above, the MEMS substrate 112 may be a wafer in some embodiments, as may be the cap 124. Thus, multiple proof masses 106 may be formed on the MEMS substrate 112 and capped, with respective stoppers 102 provided, and the resulted capped structure diced from the wafer.

In operation, the proof mass 106 may move, for example by oscillating, in the plane 122 along the direction 116. The motion may be damped by the presence of the stopper 102 in the manner described above. Moreover, should the proof mass move out-of-plane, in the z-direction, the stopper 102 may provide a limit to such motion.

Thus, according to an aspect of the present application, a method of operating a MEMS comprising a movable mass is provided. The method may comprise moving the movable mass in a planar in which the movable mass lies, and damping the motion of the movable mass using a damper or a damping stopper of a cap capping the MEMS device.

Figure 2:
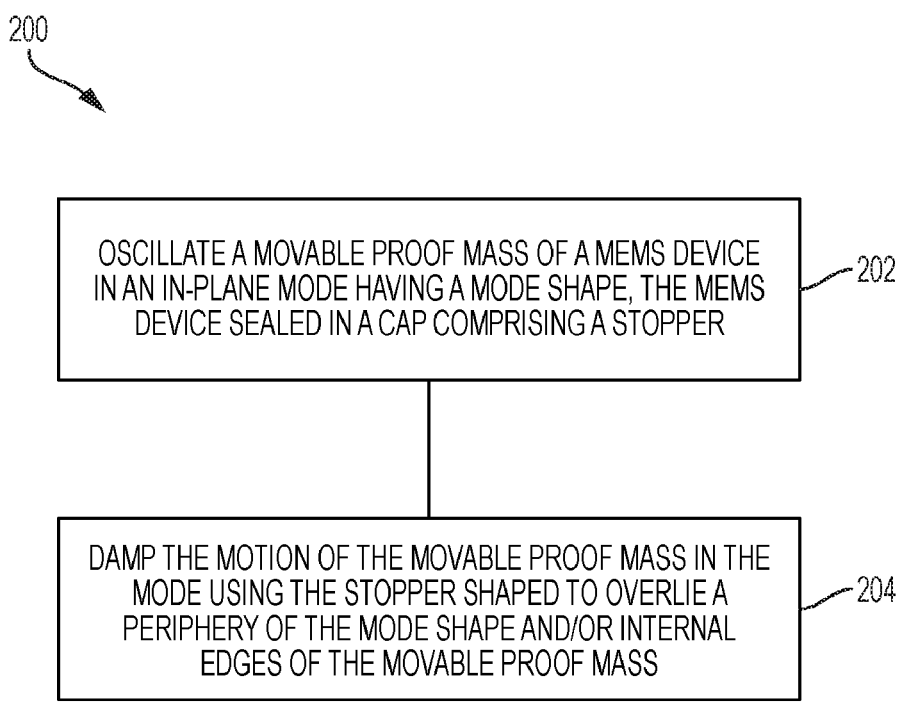
FIG. 2 is a flowchart illustrating a method of operating a MEMS device described herein, according to some non-limiting embodiments.
Figure 3A:
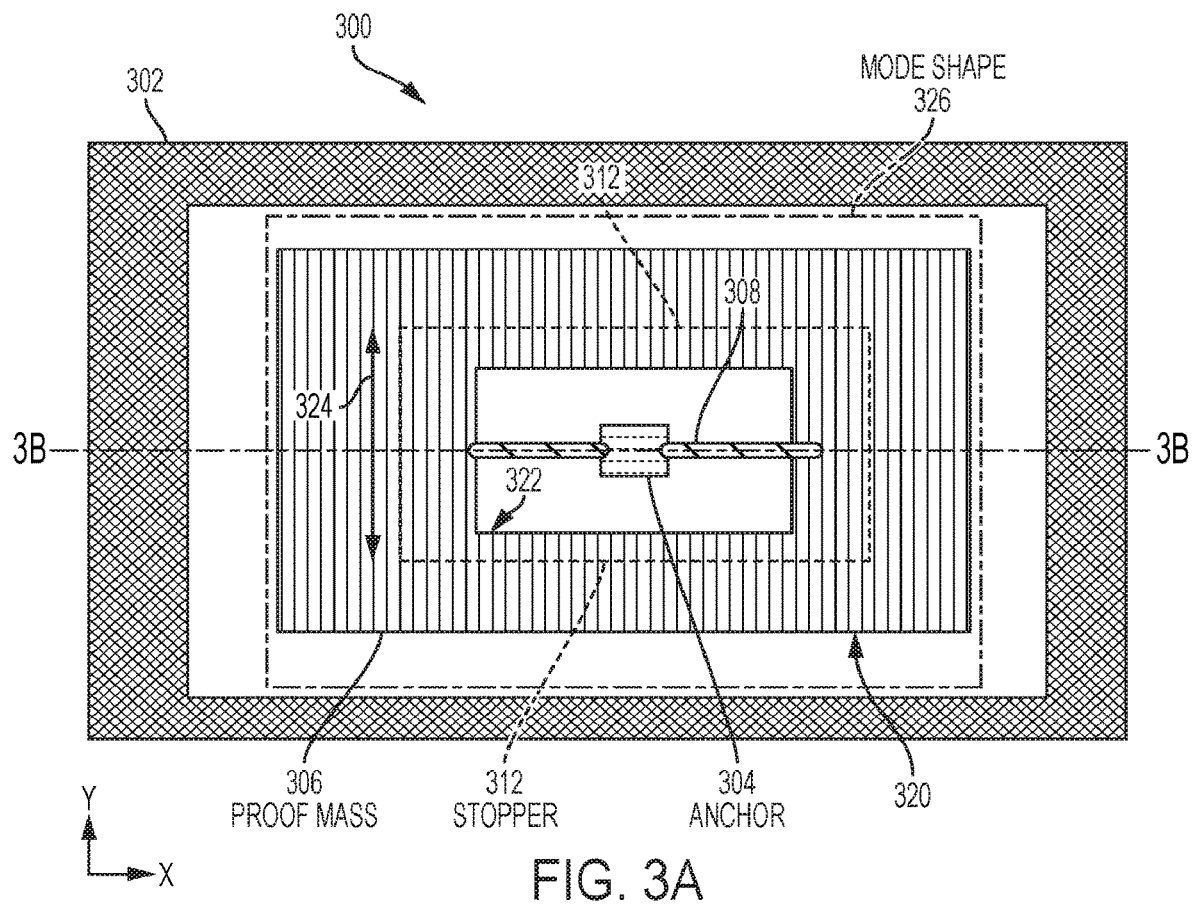
FIG. 3A is a schematic diagram illustrating a MEMS device comprising a proof mass sealed in a cap that comprises a stopper overlying an internal edge of the proof mass, according to some non-limiting embodiments.
Figure 3B:
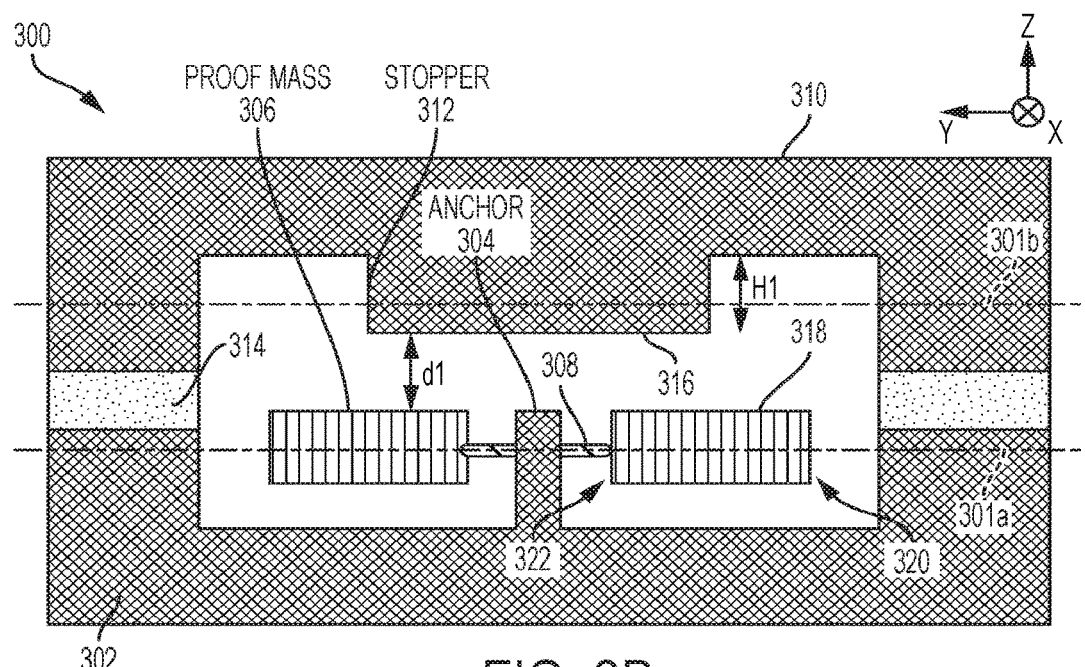
FIG. 3B is a cross-sectional view of the MEMS device in FIG. 3A along the dashed line 3B.

FIG. 2 illustrates such a method of operating a MEMS device described herein, according to some non-limiting embodiments. Method 200 may begin at stage 202, in which a movable proof mass of a MEMS device may be oscillated in an in-plane mode having a mode shape, wherein the MEMS device may be sealed in a cavity capped by a cap comprising a stopper. At stage 204, the motion of the movable proof mass may be damped using the damper or damping stopper shaped to overlie a periphery of the mode shape and/or internal edges of the movable proof mass. It should be appreciated that, while stage 204 is illustrated as following stage 202, the two stages may occur simultaneously, or at substantially the same time, in some embodiments. That is, the damping may occur as the movable proof mass moves (e.g., oscillates). While FIGS. 1A-1B illustrate an example in which the stopper 102 overlies a periphery of a mode shape of the movable proof mass, other embodiments have a different configuration. As described above, the stopper of a MEMS cap may provide damping by overlying a perimeter of an underlying movable proof mass or the mode shape of the movable proof mass. However, some movable proof masses may have interior edges, and gas flow may occur in the vicinity of those edges when the proof mass moves. Thus, a damping stopper may damp motion of an underlying proof mass by overlying the interior edges of the movable proof mass. FIGS. 3A and 3B illustrate a non-limiting example.

The MEMS device 300 may include a MEMS substrate 302, an anchor 304, a movable proof mass 306 suspended from the anchor 304 by tethers 308, and a cap 310 including a stopper 312. The cap 310 may be bonded to the MEMS substrate 302 by a bonding material 314. The stopper 312 may have a surface 316 facing and proximate a surface 318 of the proof mass 306. FIG. 3A is a top down view of multiple superimposed planes, corresponding to the planes 301a and 301b of FIG. 3B, and FIG. 3B is a cross-section of the device 300 along the line 3B in FIG. 3A.

The MEMS substrate 302 may be of the same type as MEMS substrate 112 previously described, or any other suitable MEMS substrate. The anchor 304 may be a projection from the MEMS substrate 302. The tethers 308 may be of the same type as springs 110 previously described, such as being straight beams or serpentine structures.

The proof mass 306 may be of any suitable size and shape. As illustrated, the proof mass 306 may have an outer boundary (or perimeter) or edge 320 and an inner boundary or edge 322. The tethers 308 may contact the inner edge. The proof mass 306 may be configured to move (e.g., vibrate or oscillate) in the xy-plane plane along the direction of arrow 324, defining a mode shape 326. Additional structures such as electrodes and electrical connections are omitted for simplicity of illustration.

The cap 310 may be of the same type as cap 124 previously described. The stopper 312 may have a height H1 between 20 μm and 150 μm as a non-limiting example, including any value with that range. The surface 316 of the stopper 312 may be separated from the surface 318 of the proof mass 306 by the distance d1, having any of the values described previously in connection with FIGS. 1A-1B.

As can be seen in FIGS. 3A-3B, the perimeter of the stopper 312 overlies and is larger than the inner boundary 322 of the proof mass 306, while it does not extend to the outer boundary 320. As the proof mass 306 moves gas will be pushed at the inner boundary 322, and the positioning of the stopper 312 may impede (e.g., redirect) that gas flow, thus damping motion of the proof mass 306. In an alternative embodiment, the surface 316 may have a sufficiently large area to overlie both the inner boundary 322 and the outer boundary 320.

The bonding material 314 may be the same type as those described previously in connection with bonding material 114 of FIGS. 1A-1B.

The MEMS device 300 may be operated in the manner of method 200 of FIG. 2. Other manners of operation are also possible.

In some embodiments, the stopper itself may not have a continuous planar surface adjacent the proof mass. That is, surface 316 in FIG. 3B may not be continuous and/or planar. An example of an alternative is shown in FIG. 3C.

Figure 3C:
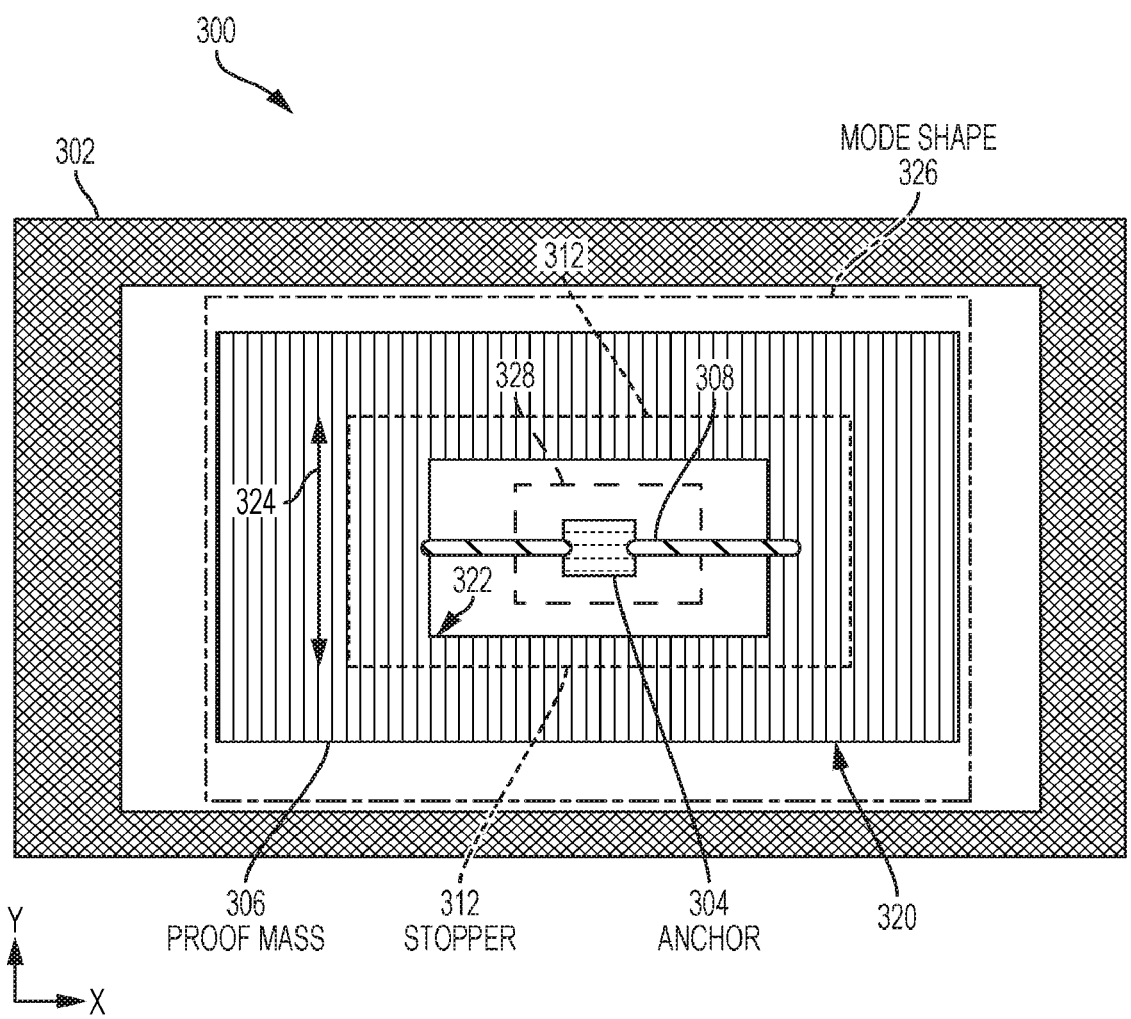
FIG. 3C is a schematic diagram of an alternative to FIG. 3A in which the stopper has a hole therein.

FIG. 3C illustrates an alternative to FIG. 3A in which the stopper itself includes a hole, or opening, therein. The hole is represented by dashed line 328. That is, the stopper surface adjacent the proof mass 306 may be between the dashed lines 312 and 328. Inside dashed line 328 the stopper may be recessed, for example by suitable etching. The recess or hole in the stopper may have any suitable size and/or positioning. Moreover, while a single hole is illustrated, multiple holes may be formed in the stopper, in any suitable arrangement. Thus, aspects of the present application provide a damping stopper with a non-planar surface adjacent the underlying proof mass.

Figure 4:
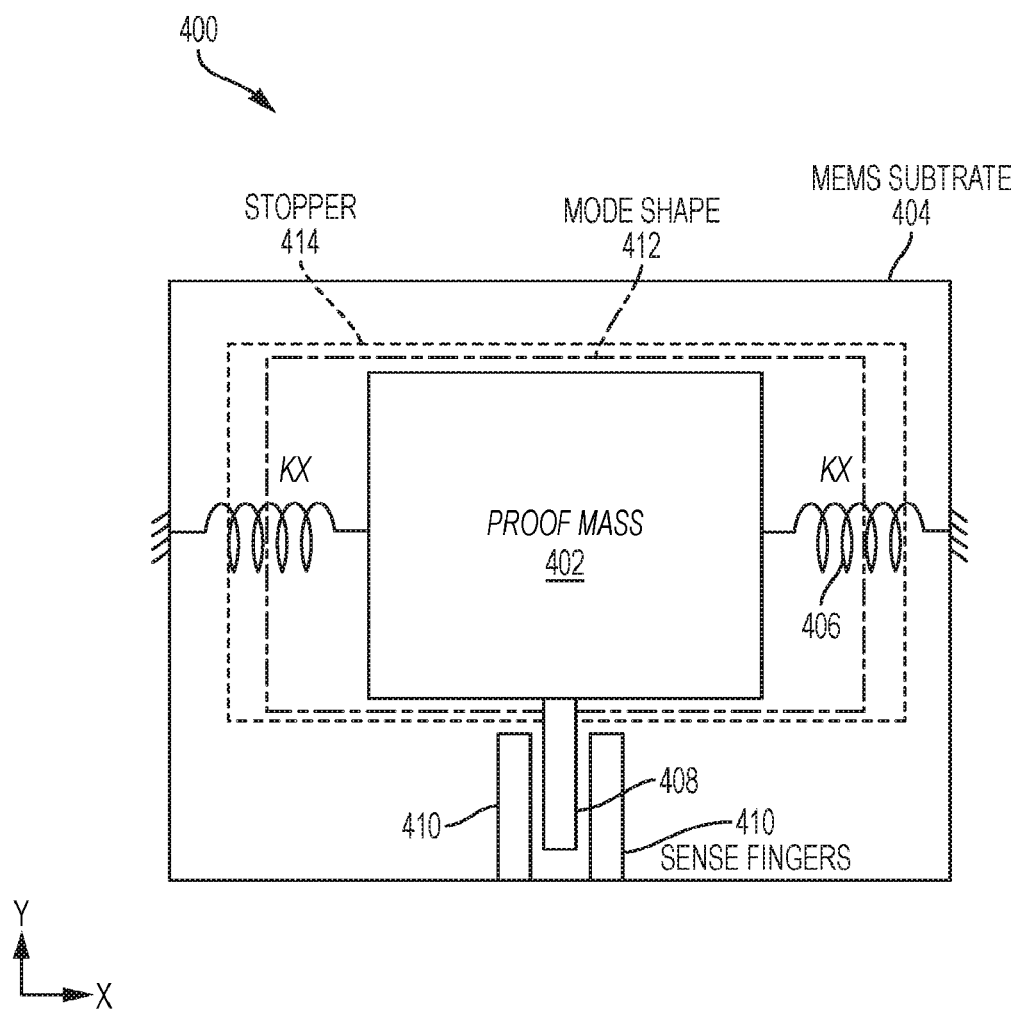
FIG. 4 is a top view illustrating a MEMS device comprising a proof mass sealed in a cap that comprises a stopper overlying a majority of the proof mass but not a sense finger, according to some non-limiting embodiments.

In some embodiments, a damping stopper of a cap for a MEMS device may be positioned to substantially overlap a mode shape of an underlying movable proof mass, while not overlying one more drive and/or sense structures. Various types of MEMS devices, such as MEMS resonators, accelerometers, and gyroscopes, may have drive and/or sense structures, such as finger-like projections. For example, capacitive MEMS accelerometers may include a capacitive comb structure, in which motion of the proof mass changes a capacitance between the fingers coupled to the proof mass and stationary fingers coupled to the substrate. FIG. 4 illustrates a top view of an example of such a device.

The MEMS device 400 includes a proof mass 402 coupled to a MEMS substrate 404 by springs 406. The proof mass 402 includes a finger 408, while two stationary fingers 410 are fixed to the substrate MEMS substrate 404. For example, the stationary fingers 410 may project upward from the substrate to be in-plane with the finger 408 of the proof mass.

The proof mass 402 may move in the xy-plane in a manner defining a mode shape 412. The motion causes a change in distance between the finger 408 and the neighboring fingers 410. Thus, the values of the capacitances between those fingers may change, and the change may be detected, for example, to ascertain the motion of the proof mass 402.

A damping stopper 414, forming part of a capping to cap the MEMS device, may be positioned to overlie the proof mass 402. In the top down view of FIG. 4, the perimeter of the stopper is superimposed over the proof mass 402. As shown, the stopper 414 may be sized and positioned to substantially overlie the proof mass 402 and the mode shape 412. However, the stopper 414 does not overlie the fingers 408 or 410.

In some embodiments, a damping stopper of a cap for a MEMS device may be employed in MEMS devices having more than one moving mass, and may provide selective damping of motion of the masses. An example MEMS device is a gyroscope, some of which have a resonating mass and an accelerating mass. In the case of a gyroscope, the resonating mass (or "resonator") may be driven in one direction, and the accelerating mass may move in response to the Coriolis force. A damping stopper may be provided to selectively damp motion of one of the masses, such as the resonating mass. Non-limiting examples are illustrated in FIGS. 5A-5C.

Figure 5A:
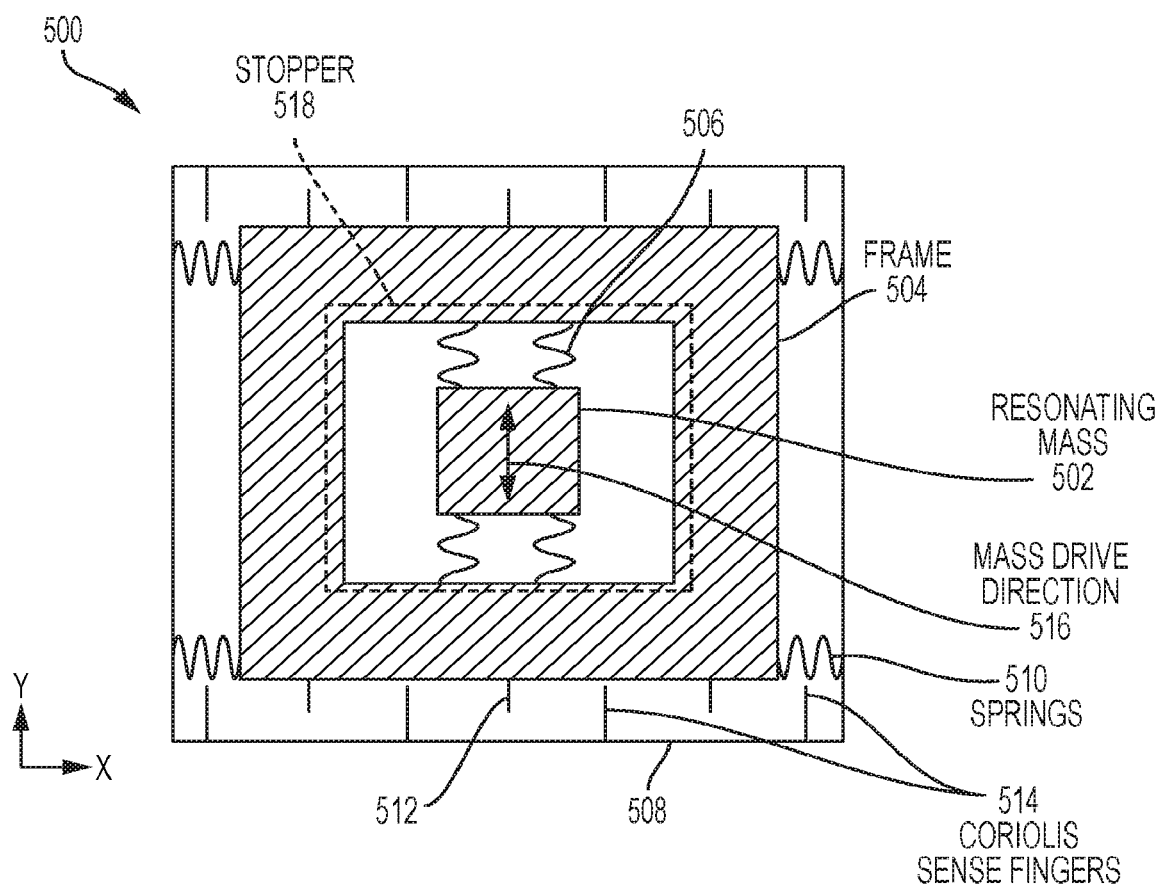
FIG. 5A is a schematic diagram illustrating a MEMS device comprising a proof mass sealed in a cap that comprises a stopper.
Figure 5B:
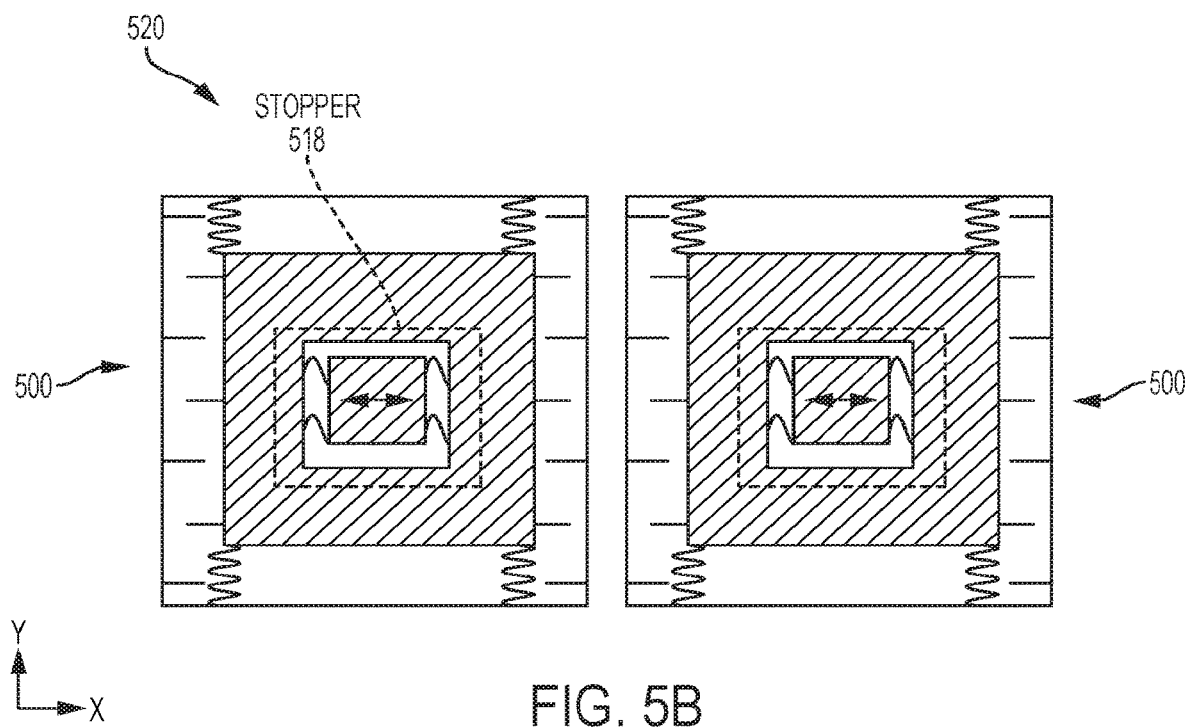
FIG. 5B is a schematic diagram illustrating a MEMS double mass gyroscope sealed in a cap that comprises a stopper for each of the two proof masses, according to some non-limiting embodiments.
Figure 5C:
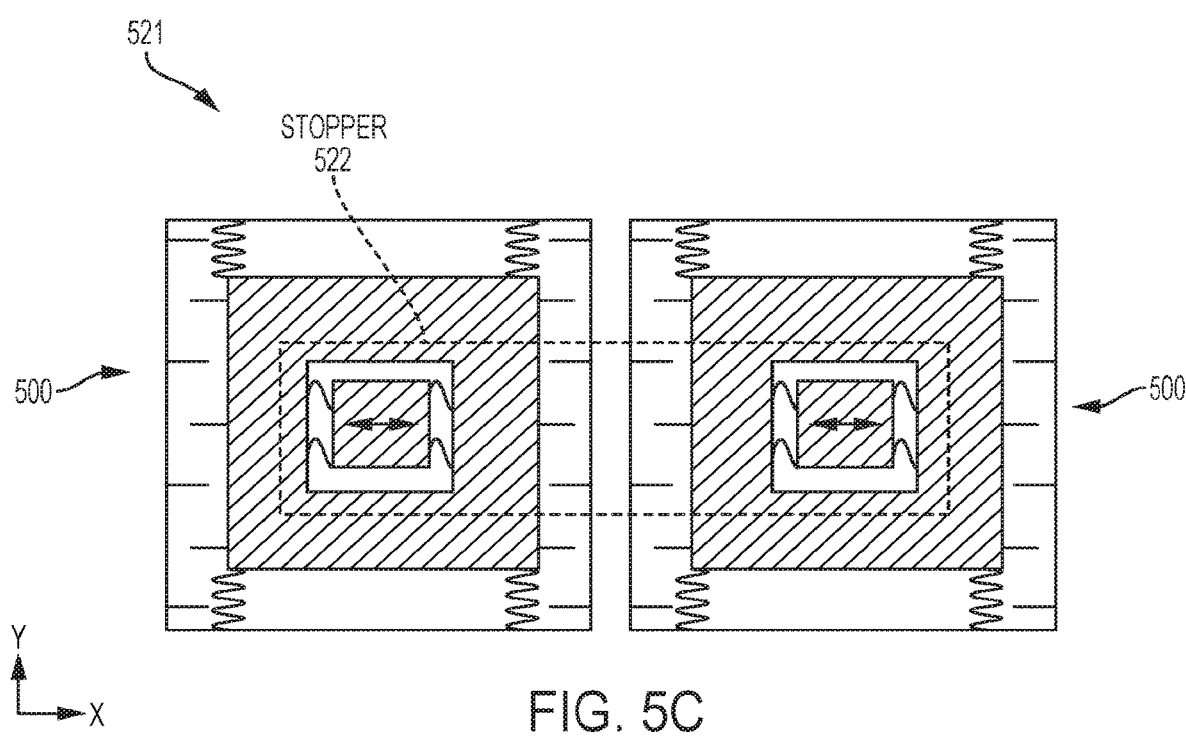
FIG. 5C is a schematic diagram illustrating a MEMS double mass gyroscope sealed in a cap that comprises a single stopper covering both proof masses, according to some non-limiting embodiments.

FIG. 5A is a top view of a MEMS device 500 including a resonating mass 502 springedly coupled with a frame 504 by springs 506. The frame 504 may by coupled to a substrate 508 by springs 510. Sense fingers 512 may extend from the frame 504 and fingers 514 may extend from the substrate 508. The sense fingers 512 and 514 may in combination form capacitances sensitive to motion of the frame 504 relative to the substrate 508.

In operation, the resonating mass 502 may be driven to oscillate in the xy-plane along the y-direction as illustrated by the arrow 516. Rotation of the MEMS device 500 in the xy-plane will cause the frame 504 to move in a direction orthogonal to the motion of the resonating mass 502. The motion will change the distances between the sense fingers 512 and 514, causing a change in the capacitances between those fingers, from which the motion may be ascertained.

A damping stopper of a cap capping the MEMS device 500 may be positioned to overlie resonating mass 502 and the space in the xy-plane between the resonating mass 502 and the frame 504. For example, a stopper 518 may have a perimeter as depicted by the dashed line superimposed over the illustrated MEMS substrate. In this manner, the stopper 518 may damp the motion of the resonating mass 502 without substantially damping motion of the frame 504. As a result, the Q of the resonating mass 502 may be lowered, without lowering the Q of the frame. Thus, embodiments of the present application provide selective damping of one or more movable masses from among a plurality of masses of a MEMS device.

FIG. 5B illustrates another configuration in which selective damping may be achieved with damping stoppers of a cap for a MEMS device. The device 520 includes two copies of the MEMS device 500 of FIG. 5A, although the MEMS devices are rotated in the xy-plane in this illustration. The device 520 may represent a dual mass gyroscope.

FIG. 5C illustrates a variation on the device 520 of FIG. 5B, shown as device 521. In this configuration, instead of the respective stoppers 518 overlying the two proof masses, a single damping stopper 522 is provided overlying both resonating masses of the MEMS devices 500 as depicted by the dashed line representing a superposition of the stopper into the xy-plane of the resonating masses.

Figure 5D:
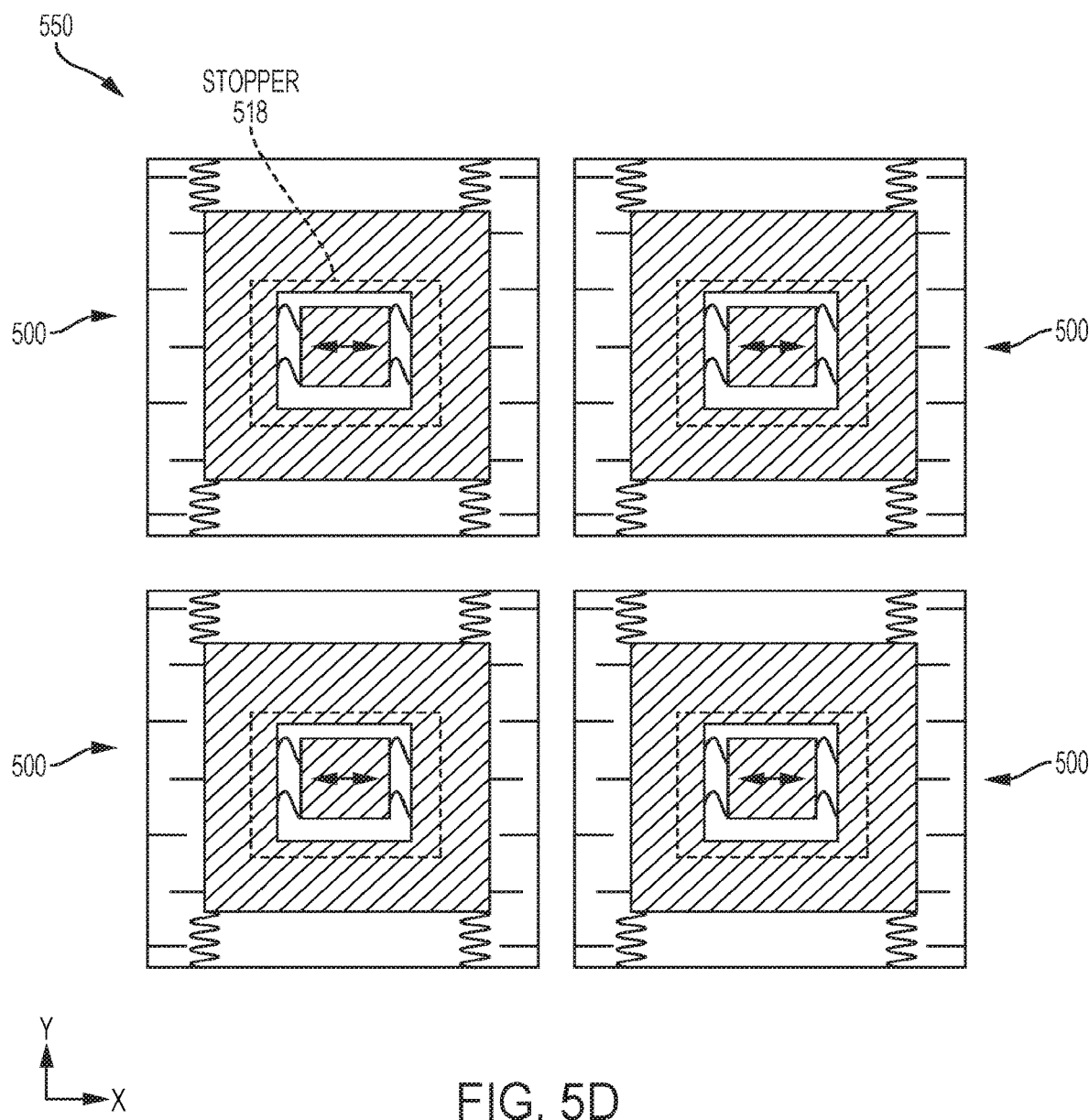
FIG. 5D is a schematic diagram illustrating a MEMS quadruple (quad) mass gyroscope sealed in a cap that comprises a stopper for each of the four proof masses, according to some non-limiting embodiments.

FIG. 5D illustrates a further embodiment, representing an extension of the device 520 of FIG. 5B to a quadruple mass device. The device 550 includes four replicas of the device 500 of FIG. 5A, although they are rotated in the x-y plane. As shown, respective stopper overlie the respective proof masses.

Figure 5E:
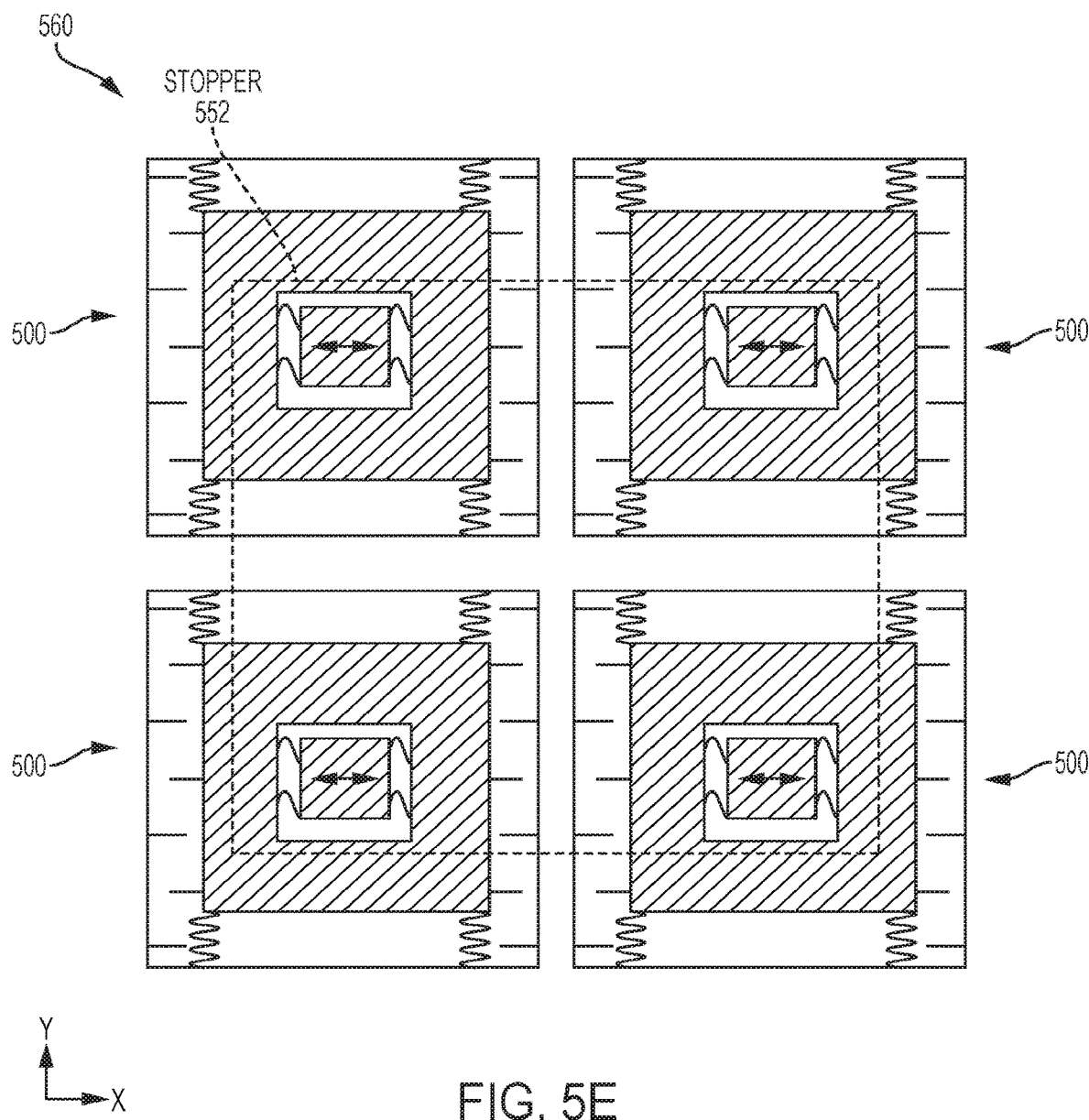
FIG. 5E is a schematic diagram illustrating a MEMS quadruple (quad) mass gyroscope sealed in a cap that comprises a single stopper covering the four proof masses, according to some non-limiting embodiments.

FIG. 5E illustrates a further configuration. In this non-limiting example, a MEMS device 560 is provided including four replicas of MEMS device 500. A damping stopper 552 is provided overlying the four resonating masses of the MEMS device 560 as depicted by the dashed line representing a superposition of the stopper into the xy-plane of the resonating masses. Thus, in some embodiments a quadruple mass gyroscope is provided with a damping stopper configured to damp in-plane motion of the resonating masses of the gyroscope.

Figure 6:
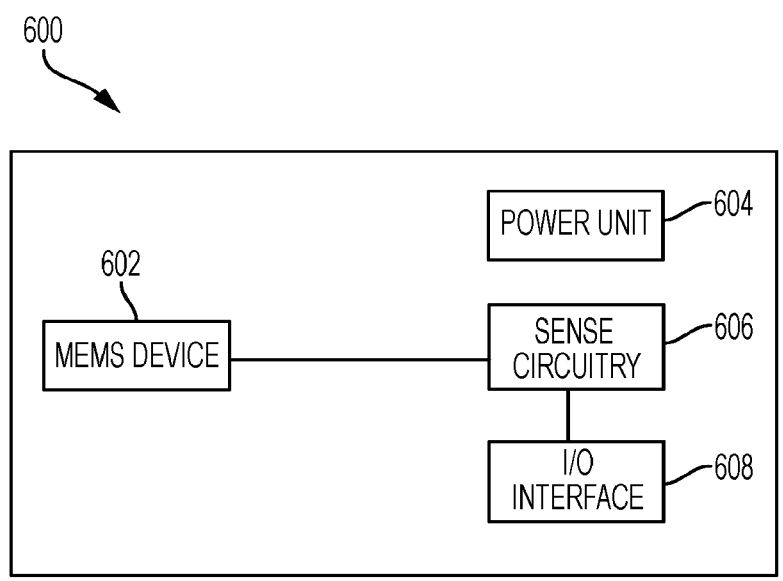
FIG. 6 is a block diagram illustrating a system comprising a MEMS device of the types descried herein, according to some non-limiting embodiments.

FIG. 6 illustrates an example of one type of system incorporating a MEMS device of the types described herein. The system 600 includes a capped MEMS device 602 having a damping stopper, read-out (or sense) circuitry 606, input/output (I/O) interface 608 and power unit 604. The MEMS device 602 may be any of the types described herein. In some embodiments, the read-out circuitry 606 and I/O interface 608 may be an application specific integrated circuit (ASIC) with control functionality.

The read-out circuitry 606 may be configured to provide signals sensed by the MEMS device 602, such as acceleration or rotation signals. The signal(s) produced may be single-ended, while in other embodiments they may be differential. The read-out circuitry may include any suitable components for performing such read-out functions, as well as circuitry for signal processing functions such as filtering, amplifying, and demodulating. The read-out circuitry may comprise a trans-impedance amplifier in some embodiments. The read-out circuitry may be an application specific integrated circuit (ASIC) in some embodiments, and may be formed on a different substrate from the MEMS device, or on the same substrate in some embodiments.

In the system of FIG. 6, the read-out circuitry 606 is connected to I/O interface 608, which may serve as a communication interface through which the system 600 communicates with an external device, such as a remote computer or server. Thus, the I/O interface 608 may transmit the sensed signals outside system 600 for further processing and/or display. Additionally or alternatively, the I/O interface 608 may receive communications from an external device such as control signals, wireless charging signals, or software updates.

The I/O interface 608 may be wired or wireless. Suitable wired connections include Universal Serial Bus (USB) and Firewire connections, among others. In those embodiments in which a wired connection is used, the connection may be pluggable. Wired connections may be used in settings in which the system 600 is relatively immobile, for example when fixed on a substantially stationary object, or when the distance between system 600 and an external device with which it communicates remains relatively constant. In some embodiments, however, the I/O interface may be wireless, for example communicating via a flexible radio frequency (RF) antenna.

Figure 7:
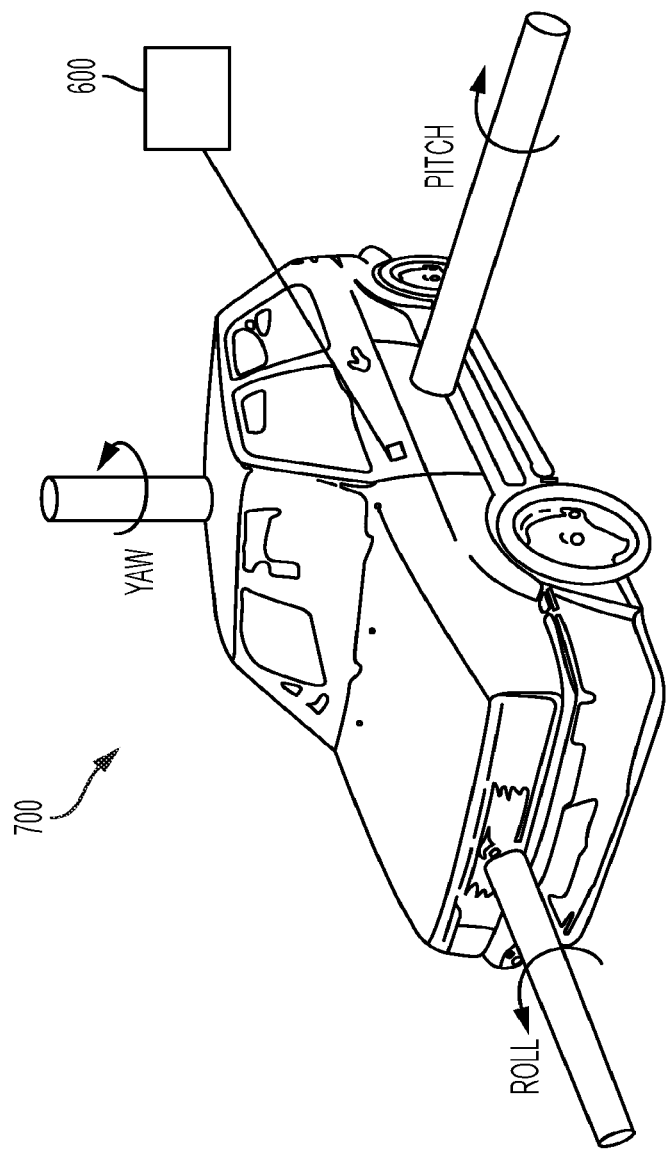
FIG. 7 illustrates a vehicle comprising the system of FIG. 6, according to some non-limiting embodiments.

Another setting in which aspects of the present application may be implemented is in automobiles, or other vehicles, such as boats or aircrafts. FIG. 7 illustrates schematically a car 700 comprising the system 600 of FIG. 6. System 600 may be disposed in any suitable location of car 700. System 600 may be configured to sense roll, pitch and/or yaw angular rates. System 600 may be configured to provide, using I/O interface 608, sensed angular rates to a computer system disposed in car 700 and/or to a computer system disposed on a base station outside car 700. While FIG. 7 illustrates one example, other uses of the various aspects of the present application are possible.

The terms "approximately", "substantially," and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A MEMS device, comprising:
a first movable proof mass; and
a cap covering the first movable proof mass, wherein the cap comprises a rigid stopper overlying greater than 50% of the first movable proof mass.

2. The MEMS device of claim 1, further comprising a second movable proof mass covered by the cap, wherein the first movable proof mass has an outer boundary adjacent an inner boundary of the second movable proof mass, and wherein the stopper overlies the outer boundary of the first movable proof mass and the inner boundary of the second movable proof mass.

3. The MEMS device of claim 2, wherein the stopper does not cover the second movable proof mass.

4. The MEMS device of claim 3, further comprising an element that connects the first and second movable proof masses to each other.

5. The MEMS device of claim 4, wherein the second movable proof mass is concentric with and outside of the first movable proof mass.

6. The MEMS device of claim 2, comprising a third movable proof mass, wherein the stopper covers greater than 50% of the third movable proof mass.

7. The MEMS device of claim 6, comprising fourth and fifth movable proof masses, wherein the stopper covers greater than 50% of each of the fourth and fifth movable proof masses.

8. The MEMS device of claim 1, wherein the stopper has a surface adjacent to and substantially parallel with the first movable proof mass, the surface of the stopper having a surface area between 75% and 125% of a mode shape corresponding to the first movable proof mass.

9. The MEMS device of claim 1, wherein the stopper has a surface adjacent to and substantially parallel with the first movable proof mass, the surface being discontinuous.

10. A MEMS device, comprising:
a resonator; and
a cap covering the resonator, wherein
the cap comprises a rigid stopper overlying greater than 50% of the resonator.

11. The MEMS device of claim 10, further comprising a movable proof mass covered by the cap, wherein the resonator has an outer boundary adjacent an inner boundary of the movable proof mass, and wherein the stopper overlies the outer boundary of the resonator and the inner boundary of the movable proof mass.

12. The MEMS device of claim 11, wherein the stopper does not cover an outer boundary of the movable proof mass.

13. The MEMS device of claim 10, wherein the stopper has a surface substantially parallel with a top surface of the resonator, the surface of the stopper being separated from the top surface of the resonator by a gap with a distance less than 20 µm.

14. The MEMS device of claim 10, wherein the cap comprises a recess surrounding the stopper.

15. The MEMS device of claim 14, wherein the recess has a depth between 20 µm and 150 µm.

16. The MEMS device of claim 10, wherein the resonator is configured to move in-plane.

17. A system comprising:
a first movable proof mass coupled to a substrate;
a cap covering the first movable proof mass, wherein the cap comprises a stopper overlying greater than 50% of the first movable proof mass;
a sense electrode disposed on the substrate and forming a sense capacitor with a portion of the first movable proof mass; and
sense circuitry coupled to the sense capacitor and configured to provide signals sensed by the sense capacitor.

18. The system of claim 17, further comprising an input/output (I/O) interface coupled to the sense circuitry and configured to transmit the signals sensed by the sense capacitor external to the system.

19. The system of claim 18, wherein the I/O interface is configured to receive control signals from an external device.

20. The system of claim 17, further comprising a second movable proof mass covered by the cap, wherein the first movable proof mass has an outer boundary adjacent an inner boundary of the second movable proof mass, and wherein the stopper overlies the outer boundary of the first movable proof mass and the inner boundary of the second movable proof mass.

* * * * *